(12) United States Patent
Burrows

(10) Patent No.: US 6,567,598 B1
(45) Date of Patent: May 20, 2003

(54) TITANIUM-INDIFFUSION WAVEGUIDES

(75) Inventor: Lee J. Burrows, San Francisco, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/419,349

(22) Filed: Oct. 15, 1999

Related U.S. Application Data

(63) Continuation-in-part of application No. 09/309,361, filed on May 11, 1999.
(60) Provisional application No. 60/084,940, filed on May 11, 1998.

(51) Int. Cl.[7] ................................................ H04N 5/89
(52) U.S. Cl. ............................ 385/129; 385/132; 385/2
(58) Field of Search ............................... 385/129–132, 385/141, 1–3, 8–9, 14–15, 39–40, 45, 48; 359/322, 238, 248

(56) References Cited

U.S. PATENT DOCUMENTS

| | | | |
|---|---|---|---|
| 4,196,963 A | | 4/1980 | Chen et al. ............... 350/96.12 |
| 4,640,736 A | | 2/1987 | Holman ....................... 156/603 |
| 5,055,169 A | * | 10/1991 | Hoch, Jr. et al. ......... 204/192.3 |
| 5,064,684 A | | 11/1991 | Mir et al. .................... 427/53.1 |
| 5,095,518 A | | 3/1992 | Young et al. ................ 385/130 |
| 5,193,136 A | | 3/1993 | Chang et al. ............... 385/129 |
| 5,436,992 A | * | 7/1995 | Wang et al. ................... 385/45 |
| 5,526,448 A | * | 6/1996 | Nagata et al. ................. 385/14 |
| 5,832,155 A | * | 11/1998 | Rasch et al. ................... 385/48 |
| 6,185,355 B1 | * | 2/2001 | Hung ............................. 385/2 |
| 6,195,191 B1 | * | 2/2001 | Osenbach et al. .......... 359/238 |

FOREIGN PATENT DOCUMENTS

| | | | |
|---|---|---|---|
| EP | 0 635 735 | 6/1994 | ............ G02B/6/12 |
| EP | 0 652 457 | 9/1994 | ............ G02F/1/035 |
| WO | WO99/63393 | 12/1999 | |

OTHER PUBLICATIONS

Nagata, et al. "Reduced thermal decomposition of OH–free LiNbO$_3$ substrates even in a dry gas atmosphere," Journal of Materials Research, Aug. 1996, Mater. Res. Soc., USA, vol. 11, No. 8, pp. 2085–2091.

Kwiatkowski, et al. "Nearly cut–off modes caused by diffusion in lithium niobate," Journal of Applied Physics, vol. 76, No. 10, pt. 1, pp. 5877–5885, Nov. 15, 1994.

Nozawa, et al. "Water Vapor Effects on Titanium Diffusion into LiNbO$_3$ Substrates," Japanese Journal of Applied Physics, vol. 29, No. 10, pp. 2180–2185, Oct. 1, 1990.

\* cited by examiner

*Primary Examiner*—Frank G. Font
*Assistant Examiner*—Sang H. Nguyen
(74) *Attorney, Agent, or Firm*—Thelen Reid & Priest LLP; David B. Ritchie

(57) ABSTRACT

A method for fabricating titanium-indiffusion waveguides in optical modulators and other optical waveguide devices includes disposing titanium strips in a waveguide pattern on the surface of a crystalline substrate, such as lithium niobate or lithium tantalate, and indiffusing the titanium atoms into the crystalline substrate by pressurizing above ambient atmospheric pressure an oxygen gas atmosphere enclosing the crystalline substrate, heating in the oxygen gas atmosphere, maintaining temperature and pressure for an indiffusion period, and cooling to ambient temperature. A powder formed of the same chemical composition as the crystalline substrate may be introduced into the indiffusion process to limit the crystalline substrate from outgassing alkaline earth metal oxide during the indiffusion period. An indiffusion container that allows for crystalline substrates to be annealed in the presence of a powder without contaminating the substrate with the powder during the indiffusion process may be used. Waveguides manufactured in accordance with the method exhibit superior drift performance.

76 Claims, 5 Drawing Sheets

TITANIUM-INDIFFUSION WAVEGUIDES

CROSS-REFERENCE TO RELATED APPLICATIONS

This is a continuation-in-part of co-pending U.S. Pat. application Ser. No. 09/309,361, filed May 11, 1999, and entitled, "Method for Pressurized Annealing of Lithium Niobate and Resulting Lithium Niobate Structures",by inventor Lee J. Burrows assignor to California Institute of Technology, a California non-profit corporation. Patent application Ser. No. 09/309,361 claims the benefit of provisional patent application Serial No. 60/084,940 filed May 11, 1998, and entitled "Pressurized Annealing of Lithium Niobate".

This application is also related to U.S. patent application Ser. No. 09/418,725, filed on even date herewith entitled "Titanium-Indiffusion Waveguides and Methods of Fabrication" by inventors Lee J. Burrows and William B. Bridges, both assignors to the California Institute of Technology; and U.S. patent application Ser. No. 09/419,347 filed on even date herewith entitled "Ion Exchange Waveguides and Methods of Fabrication" by inventor Lee J. Burrows, assignor to the California Institute of Technology; and U.S. patent application Ser. No. 09/157,652 filed Sep. 21, 1998 entitled "Articles Useful as Optical Waveguides and Method for Manufacturing Same" by inventor Lee J. Burrows, assignor to the California Institute of Technology.

STATEMENT AS TO RIGHTS TO INVENTIONS

The United States Government has certain rights in this invention pursuant to Grant No. F-19628-95-C-0002 awarded by the United States Air Force.

BACKGROUND OF THE INVENTION

1. Field Of The Invention

The present invention relates to a method for fabricating titanium indiffusion (Ti-indiffusion) waveguides in optical modulators using a pressurized indiffusion process and the resulting waveguides and modulators. More particularly, the present invention relates to a method for fabricating lithium niobate or lithium tantalate modulators using a pressurized oxygen atmosphere indiffusion process to further diffuse titanium atoms in the waveguide while limiting the formation of undesired lithium niobate or lithium tantalate phases.

2. Background

Optoelectronic components can be fabricated on several types of substrates including polymers, glass, semiconductors (e.g., gallium arsenide (GaAs) and indium phosphide (InP)) and inorganic materials (e.g., lithium niobate ($LiNbO_3$) and lithium tantalate ($LiTaO_3$)). Characteristically, an electro-optic material is one in which the index of refraction changes with the application of an electric field. One of the most important components in optoelectronic systems is the modulator. Three competing technologies in this realm are: direct modulation of a semiconductor laser, semiconductor electro-absorption modulators, and the lithium niobate modulator. Currently, lithium niobate modulators are the modulation devices of choice for many systems because they yield high performance, are a relatively mature technology and other modulation schemes impose limits not faced with lithium niobate modulators.

Lithium niobate has proven to be a suitable medium for components such as amplitude modulators, phase modulators, optical switches, polarization transformers, tunable filters and wavelength-selective optical add/drop filters. Lithium niobate has also been used as the host for solid state lasers using rare earth ions, e.g., erbium. Most current telecommunication and cable television system applications for $LiNbO_3$ modulators involve discrete components for the optical transmitter subsystem. This configuration couples continuous wave lasers, typically diode-pumped YAG or erbium fiber oscillators, with lithium niobate external modulators and various wavelength and power stabilization components.

Lithium niobate is a popular nonlinear optical crystal for several reasons including its large electro-optic coefficients, the ease with which high quality optical waveguides are fabricated and its amenability to conventional integrated circuit processing techniques. High quality optical waveguides are those that possess low loss and relatively high power handling capabilities. Additionally, $LiNbO_3$ is a hard material, thus it is easily polished for optical fiber coupling which makes its use in optical network systems relatively uncomplicated. It is also a relatively inexpensive crystal, due in part to its long history of use in surface-acoustic-wave (SAW) filters for radio frequencies. By comparison, lithium tantalate $LiTaO_3$ is essentially interchangeable with lithium niobate as far as modulator characteristics are concerned, but the use of $LiTaO_3$ is often cost prohibitive because it is not as widely commercially used as $LiNbO_3$. Additionally, other optical crystalline structures having the formula $RMO_3$, where R is an alkaline earth metal, M is a Group IVB or Group VB metal, and O is oxygen, can also be used in the fabrication of waveguides and modulators.

For example, one type of modulator incorporating the use of $LiNbO_3$ is a Mach-Zehnder modulator. In a Mach-Zehnder modulator an incoming optical beam is split equally at a Y junction into two parallel waveguides, which then recombine at another Y junction after some distance. Electrodes are used to apply an electric field in the region of the optical waveguides. The electric field causes a relative phase shift between the two branches. If the phase shift in both arms is the same, then the two optical signals will recombine constructively at the second Y branch and no optical power will be lost. If there is a phase difference between the two arms, then there will be destructive interference and some optical power will be lost. The resulting destructive and constructive interference causes the output optical intensity to vary between a minimum and a maximum value.

In other electro-optic applications optical waveguide directional couplers can also be used as electro-optic modulators. In this type of modulator two waveguides are placed on the lithium niobate substrate in very close proximity to one another. The wave from one guide can "leak" into the other guide. By applying an electric field to the lithium niobate, the amount of "leakage" can be controlled, thus modulating the transfer of power from one guide to the other. Currently, different commercial application requirements favor either directional couplers or Mach-Zehnder modulators.

The advantage of high-speed, large bandwidth, digital or analog communications has led to a demand for the external modulator configuration. The most common approach utilizes a low-noise, high power diode-pumped laser whose signal is sent to the $LiNbO_3$ modulator via optical fiber. The modulator applies either analog or digital information to the optical carrier.

When using lithium niobate in the fabrication of optical waveguides and optical modulators it is desired to avoid having a niobium-rich, lithium-poor and/or oxygen poor composition. When bulk lithium niobate has such niobium rich-compositions, and is then processed at high temperatures (T>300 degrees Celsius), growth of the $LiNb_3O_8$ phase in the crystal may occur. This phase is undesirable because it is not optically transparent and leads to high losses in optical waveguides and optical modulators.

Such niobium-rich compositions can occur in two different manners during fabrication of optical waveguides and optical modulators. First, typical ion exchange procedures result in the replacement of lithium atoms in the crystal lattice with a is diffusing ion leading to a lithium niobate composition relatively rich in niobium. Second, standard high temperature (temperatures in excess of 300 degrees Celsius) processing of lithium niobate can cause $Li_2O$ out-diffusion, and result in niobium-rich, and lithium and oxygen poor compositions.

Ti-indiffusion waveguides are one of the more commonly used optical waveguides currently in existence. The Ti-indiffusion process drives titanium atoms into the crystal structure lattice causing titanium atoms to either disperse interstitially in the lattice or replace niobium atoms. This process results in one or more refractive indices (e.g., the extraordinary and ordinary refractive indices) of the crystal substrate being altered in the region where the titanium indiffusion occurs to create an optical waveguide.

Ti-indiffusion implements high temperature processing (temperatures in the range of 900 to 1100 degrees Celsius). To eliminate the undesired $LiNb_3O$ phase from forming in the crystal during Ti-indiffusion processing it is usually performed in a wet atmosphere of inert carrier gas, such as nitrogen ($N_2$) or argon ($Ar_2$), or in a wet atmosphere of oxygen ($O_2$). This type of indiffusion process involves bubbling the inert carrier gas or oxygen gas through water ($H_2O$). The wet atmosphere has been considered beneficial in the past because the $H_2O$ breaks down into $H^+$ and $OH^-$ atoms that chemically attack the $LiNb_3O_8$, phase, and break it back down into $LiNbO_3$. A typical wet atmosphere Ti-indiffusion operation is performed at a temperature of about 1050 degrees Celsius for a period of 3 to 4 hours in a wet, flowing environment. The present inventor has discovered that a drawback of this type of high temperature processing is that the $H_2O$ gives off undesirable protons ($H^+$) which are attracted by the lithium niobate and result in an inadvertent proton-exchanged surface layer occurring. These protons remain in the modulators after fabrication and flow relatively freely among the waveguides, the electrodes, the lithium niobate crystal and the buffer layer interface. It is now understood that these free flowing protons can and do adversely affect a modulator's DC-bias stability because they act as charge carriers and are driven by the applied electric fields, causing the response of the final product to drift over time when a bias is applied.

Additionally, high temperature processing (>300 degrees Celsius) leads to oxygen out diffusion of lithium niobate structures. This out diffusion of oxygen tends to form a surface layer on a lithium niobate substrate or a lithium niobate waveguide that is oxygen-poor in composition. This oxygen-poor region acts as a surface optical waveguide and causes undesirable leakage of light out of the lithium niobate substrate.

It would therefore be highly advantageous to devise a fabrication method for Ti-indiffusion waveguides that uses a new pressurized Ti-indiffusion process that inhibits both the formation of the undesirable $LiNb_3O_8$, phase in the crystal and out diffusion of $O_2$ without the process introducing significant numbers of free flowing protons that will affect the modulator's DC-bias stability.

BRIEF DESCRIPTION OF THE INVENTION

A method for fabricating titanium-indiffusion waveguides in optical modulators and other optical waveguide devices includes disposing titanium strips in a waveguide pattern on the surface of a crystalline substrate, such as lithium niobate or lithium tantalate, and indiffusing the titanium atoms into the crystalline substrate by pressurizing above ambient atmospheric pressure an oxygen gas atmosphere enclosing the crystalline substrate, heating in the oxygen gas atmosphere to a temperature within a range of about 900 degrees Celsius to about 1100 degrees Celsius, maintaining temperature and pressure for an indiffusion period exceeding about 1 hour, and cooling to ambient temperature at an appropriate ramp-down rate. In another aspect of the invention a powder formed of the same chemical composition as the crystalline substrate is introduced into the indiffusion process chamber to limit the crystalline substrate from outgassing alkaline earth metal oxide during the indiffusion period. In yet another aspect of the invention an indiffusion container is provided that allows for crystalline substrates to be annealed in the presence of powder without contaminating the substrate with the powder during the indiffusion process. Waveguides manufactured in accordance with the method exhibit superior drift performance.

DETAILED DESCRIPTION OF THE INVENTION

Those of ordinary skill in the art will realize that the following description of the present invention is illustrative only and is not intended to be in any way limiting. Other embodiments of the invention will readily suggest themselves to such skilled persons from an examination of the within disclosure.

In accordance with one presently preferred embodiment of the present invention, a method is provided for fabricating a Ti-indiffusion optical waveguide in lithium niobate ($LiNbO_3$) optical modulators using pressurized indiffusion to diffuse titanium in the waveguide. Ti-indiffusion optical waveguide fabrication involves altering one or more refractive indices (e.g., the extraordinary and ordinary refractive indices) of the crystal substrate in the region where the titanium indiffusion occurs to create an optical waveguide. The following exemplary description of the modulator fabrication process is intended to limit the introduction of undesirable free protons and lithium niobate phases into the fabrication process. FIGS. 1A–1G are cross sectional views of a lithium niobate modulator shown after completion of selected steps in a pressurized Ti-indiffusion waveguide fabrication process.

The present invention may also be defined as a method for fabricating a Ti-indiffusion waveguide in a lithium tantalate ($LiTaO_3$) optical modulator. Lithium tantalate is closely related in terms of electro-optical properties to $LiNbO_3$ but is not currently widely used in commercial electro-optical modulator applications because to do so would be cost prohibitive. The same or similar indiffusion process as described below for $LiNbO_3$ would be employed in the Ti-indiffusion waveguides fabricated from a $LiTaO_3$ substrate. Additionally, the crystal substrate that is used to form the optical modulator may be formed from a crystalline structure having the formula $RMO_3$, where R is an alkaline earth metal, M is a Group IVB or Group VB metal, and O is oxygen.

Figure 1A:
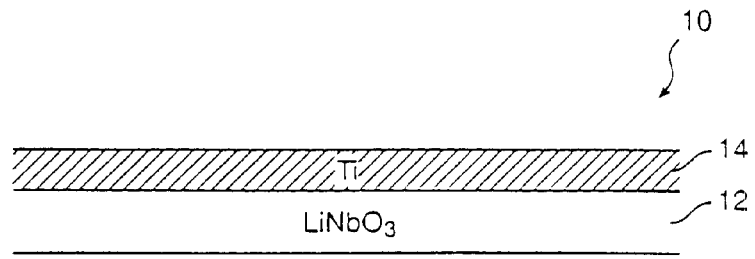
FIGS. 1A–1G are cross-sectional views of various stages in the fabrication of a Ti-indiffusion waveguide in a lithium niobate optical modulator that incorporates pressurized oxygen atmosphere Ti-indiffusion in accordance with one embodiment of the present invention.

Referring to FIG. 1A, a modulator build 10 (a partially fabricated modulator) is shown after the formation of titanium (Ti) layer 14 over $LiNbO_3$ crystal substrate 12. Ti layer 14 may be formed over $LiNbO_3$ crystal substrate 12 by an electron beam evaporation process or another suitable deposition technique. The use of electron beam evaporation to deposit titanium over the surface of a crystal, such as $LiNbO_3$ crystal substrate 12, is well known by those of ordinary skill in the art. The thickness of Ti layer 14 may range from about 400 angstroms to about 1000 angstroms, and is preferably in a range of about 550 angstroms to about 650 angstroms for a single mode, Z-cut $LiNbO_3$ crystal having an operating optical wavelength of 1.3 microns.

Figure 1B:
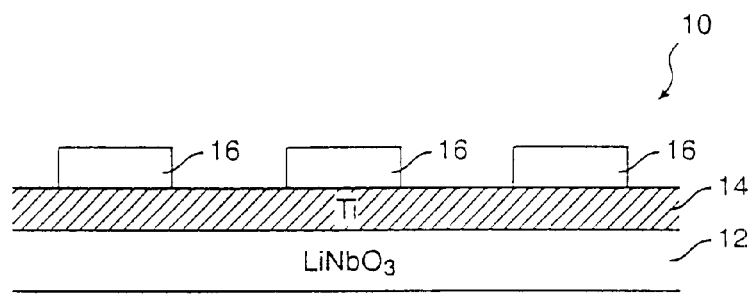

Shown in FIG. 1B is modulator build 10 after photo resist layer 16 is disposed in strip formation on the surface of Ti layer 14. A standard photolithography technique is used to place photo resist layer 16 over Ti layer 14. As shown in FIG. 1B, the photolithography process which employs the use of a waveguide template will result in the formation of strips of photo resist only in those areas where waveguides are to be fabricated. The use of such photolithography techniques are well known by those of ordinary skill in the art.

Figure 1C:
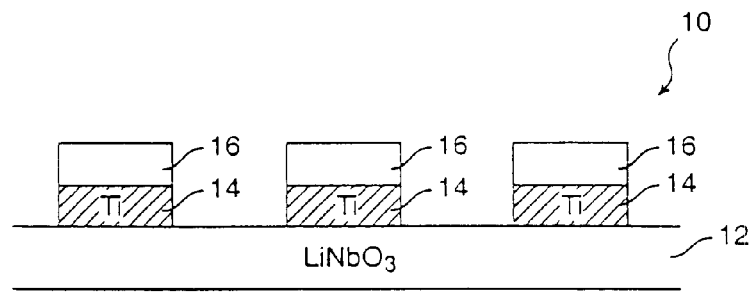

Referring to FIG. 1C, a conventional plasma etch or reactive ion etch (RIE) technique is preferably used to etch away Ti layer 14 and expose $LiNbO_3$ crystal substrate 12 in those regions not masked by photo resist layer 16. A plasma etch or RIE procedure is chosen so that it selectively etches away the chosen photo resist material. It should be noted that the etch process should preferably not involve wet etching. Wet etching generally involves the use of acids and thus would generally be likely (unless deuterium-based acids are used) to introduce free protons into the waveguide structure that would adversely affect the $LiNbO_3$. As previously discussed, free protons in the waveguide tend to increase the likelihood of output voltage drift over time.

Figure 1D:
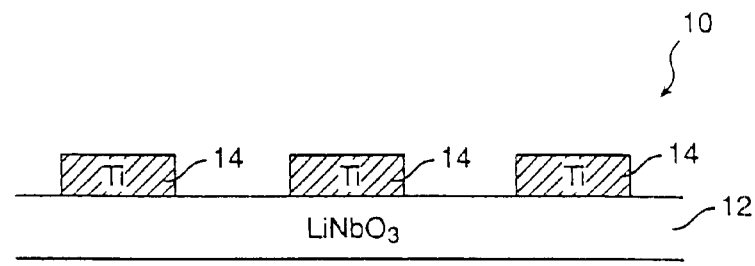

After the completion of the etch process, the photo resist material is stripped away by subjecting modulator build 10 to an oxygen plasma or by using an acetone wash procedure. As before, use of acids for stripping purposes should preferably be avoided as they have a tendency to introduce free protons into the modulator structure and these free protons increase the likelihood of drift in the modulators. The resulting structure is shown in FIG. 1D with Ti layer 14 remaining only in the areas above $LiNbO_3$ crystal substrate 12 where waveguides are to be constructed. FIG. 1D is representative of modulator build 10 prior to the construct undergoing the pressurized Ti-indiffusion process of the present invention.

Figure 2A:
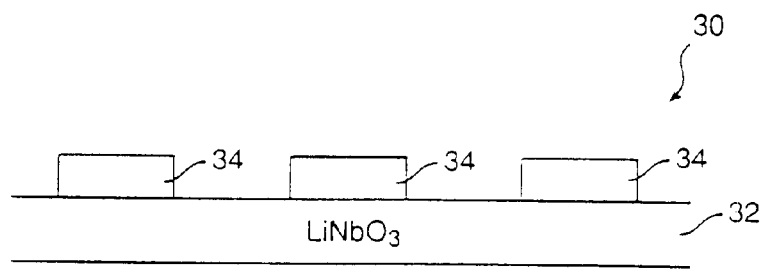
FIGS. 2A–2C are cross-sectional views of an alternative titanium deposition technique that may be used in the fabrication of a Ti-indiffusion waveguide in a lithium niobate optical modulator that incorporates pressurized oxygen atmosphere Ti-indiffusion in accordance with one embodiment of the present invention.
Figure 2B:
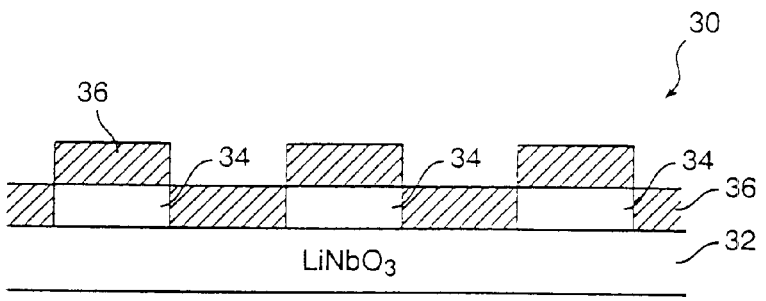
Figure 2C:
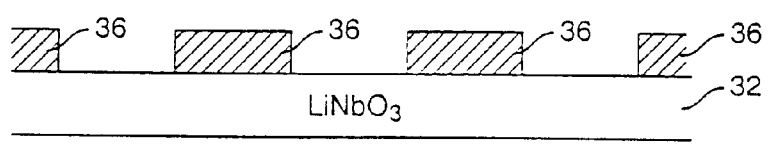

Shown in FIGS. 2A–2C is an alternate "lift off" method for forming titanium waveguide strips on lithium niobate (and similar) crystal structures in accordance with one embodiment of the present invention. FIG. 2A illustrates modulator build 30 having photo-resist layer 34 disposed above $LiNbO_3$ crystal substrate 32. A standard photolithography technique is used to place photo resist layer 34 over $LiNbO_3$ crystal substrate 32. As shown in FIG. 2A the photolithography process which employs the use of a reverse waveguide template will result in the formation of strips of photo resist layer 34 only in those areas where no waveguides will be fabricated. The use of such photolithography techniques are well known by those of ordinary skill in the art.

FIG. 2B shows modulator build 30 after Ti layer 36 has been disposed atop photo resist layer 34 and $LiNbO_3$ (or similar) crystal substrate 32. A standard electron deposition technique may be employed to deposit titanium on to modulator build 30. The thickness of Ti layer 36 may range from about 400 angstroms to about 1000 angstroms, and is preferably in a range of about 550 angstroms to about 650 angstroms for a single mode, Z-cut $LiNbO_3$ having an optical wavelength of 1.3 microns.

FIG. 2C depicts modulator build 30 after photo resist layer 34 has been "lifted off" $LiNbO_3$ crystal substrate 32. The lift off process can be accomplished by subjecting modulator build 30 to an acetone or propenyl wash operation. The "lift off" process removes photo resist layer 34 and that portion of Ti layer 36 that is directly above photo resist layer 34. After the "lift off" process Ti layer 36 remains only in those regions where waveguides will be formed. FIG. 2C is representative of modulator build 30 prior to the construct undergoing the pressurized Ti-indiffusion process of the present invention.

In accordance with another embodiment of the present invention, in preparation for the Ti-indiffusion process the modulator build may be placed in a container that allows for lithium niobate powder to be placed in close proximity to the lithium niobate substrate. Within the container the modulator build and the lithium niobate powder are isolated by a porous interface that allows gas to flow between the lithium niobate substrate and the lithium niobate powder but does not allow for the lithium niobate powder to contaminate the modulator build. The container is closed by slip fit caps that allow for oxygen gas to enter into the container when a pressure differential exists yet restricts the outward flow of lithium oxide ($Li_2O$) in the absence of a pressure differential.

The purpose of the lithium niobate powder is to induce lithium oxide ($Li_2O$) outgassing in the lithium powder during the indiffusion process while retarding the same outgassing in the $LiNbO_3$ crystal substrate. As previously discussed lithium niobate will outgas $Li_2O$ when exposed to temperatures in excess of 300 degrees Celsius. The outgassing leads to a lithium niobate substrate that is poor in lithium. Lithium poor structures are prone to the $LiNb_3O_8$ phase forming in the crystal. The $LiNb_3O_8$ phase is not optically transparent and affects high losses in the waveguides. The lithium niobate powder has a much larger surface area being a collection of granules rather than a monolithic structure and is generally more reactive than the LiNbO$_3$ crystal substrate; therefore outgassing will occur more readily in the lithium niobate powder. Once the indiffusion environment is saturated with Li$_2$O outgassed from the powder, the LiNbO$_3$ crystal substrate is less likely to outgas Li$_2$O.

Figure 3A:
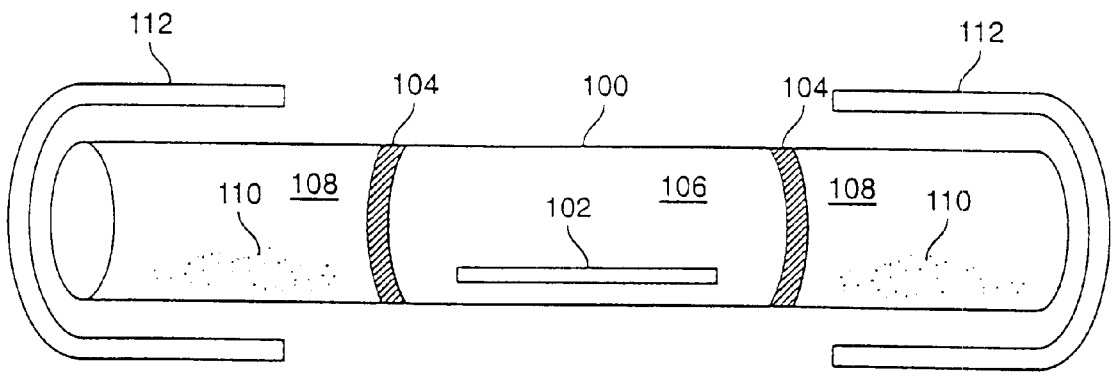
FIG. 3A is a cross-sectional view of a container used for annealing lithium niobate structures in an environment having lithium niobate powder in accordance with one embodiment of the present invention.

Shown in FIG. 3A is a cross-sectional illustration of such a indiffusion container 100 having both a modulator build and lithium niobate powder contained within. This illustration is shown by way of example, other containers that meet this intent and purpose are also feasible and within the inventive concepts herein disclosed. The indiffusion container 100 is a tube-like structure that may be fabricated from a high temperature ceramic material such as aluminum oxide (Al$_2$O$_3$). The modulator build 102 is placed in the center region of the tube and two porous plugs 104 are positioned within the tube a short distance from the tube endings. The porous plugs 104 may comprise any high-temperature material such as Al$_2$O$_3$ or a similar material. By way of example, the porosity of porous plugs 104 may be defined by the material having a plurality of holes of diameter on the order of about 20 microns. Plugs 104 allow for the relatively free flow of O$_2$ and Li$_2$O gases between the chamber 106 housing the LiNbO$_3$ crystal and the chamber(s) 108 housing the lithium niobate powder. Once the plugs 104 are positioned within the container 100, lithium niobate powder 110 is placed in one end or both ends of the plugged indiffusion container 100. The amount of lithium niobate powder used will be dependant on the internal area of the sealable container. By way of example, the amount of the lithium niobate powder may be 2.5 grams for a tube having a volume of about 1.0 in$^3$ to about 2.0 in$^3$. Once the lithium niobate powder 110 has been properly positioned in the tube, the tube is capped at both ends with loose slip fit caps 112 that are typically formed from the same high temperature material as container 100. Slip fit caps 112 will allow oxygen gas to enter container 100 when a pressure differential exists yet restrict the outward flow of Li$_2$O during the diffusion process when the environment is pressure normalized (i.e., no significant pressure gradient exists).

Additionally, other indiffusion containers can also be configured. For example, an indiffusion container having one chamber or region for containing modulator build 102, a second region containing lithium niobate powder 110 and a porous wall or plug 104 separating the two regions is also feasible and within the inventive concepts herein disclosed.

Figure 3B:
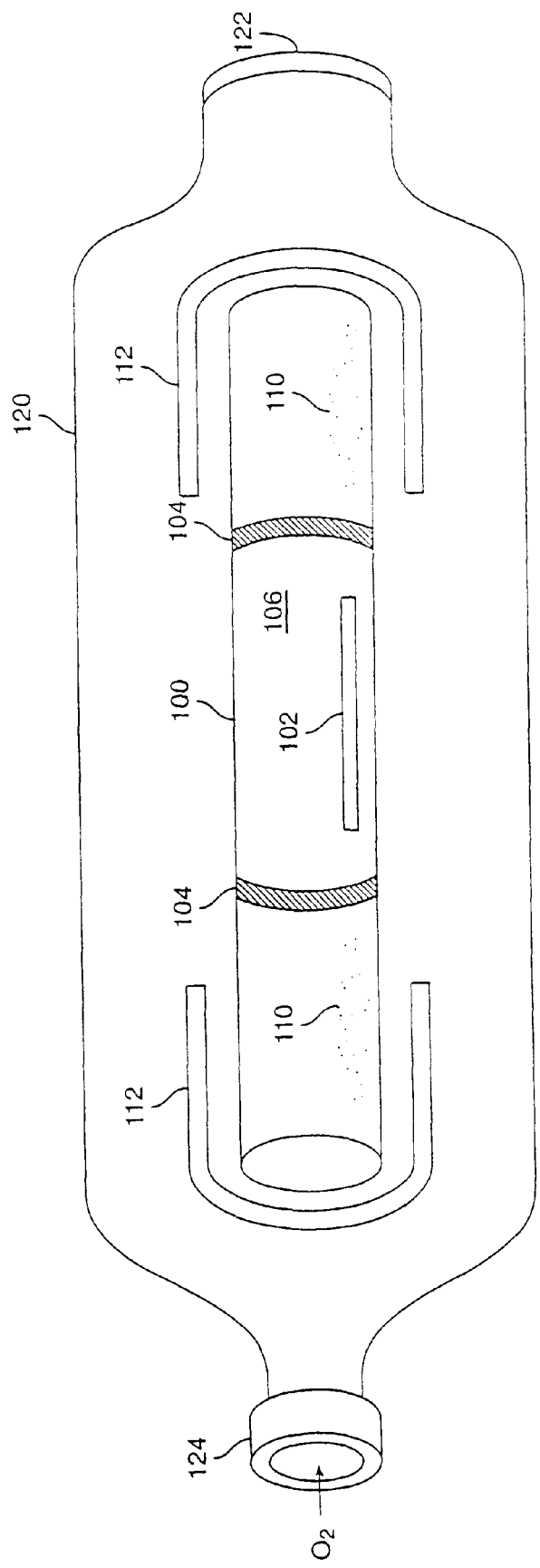
FIG. 3B is a cross-sectional view of a pressurizable vessel used for annealing lithium niobate in accordance with one embodiment of the present invention.

Once the container of FIG. 3A is properly assembled it can be placed within a sealable and pressurizable vessel. A cross-sectional view of such a vessel is shown in FIG. 3B, enclosing the container 100 of FIG. 3A. The pressurizable vessel 120 is typically formed from a metal material such as stainless steel or a quartz or ceramic tube with pressure fittings on it. In this illustration vessel 120 is tube-like in structure and has fittings 122 and 124 at opposite ends of vessel 120. Fitting 122 is a fixed fitting and fitting 124 allows for vessel 120 to be vacuum pumped and pressurized with oxygen gas.

Additionally, Ti-indiffusion with lithium niobate powder can be undertaken without the use of the container, such as the one shown in FIG. 3A. It is also possible and within the inventive concept herein disclosed to place the lithium niobate powder directly in pressurized vessel 120. However, the quantity of required lithium niobate powder increases substantially when the powder is placed directly inside the pressurized vessel, making this alternate embodiment, in most instances, more costly.

The pressurized Ti-indiffusion process begins by placing modulator build 100 in a conventional commercial high temperature oven. Any suitable oven can be used as the indiffusion chamber and the use of such ovens are widely known by those of ordinary skill in the art. It is possible to use an indiffusion oven that has pressurizing capabilities in which case the use of the separate pressurizable vessel of FIG. 3B would be unnecessary. Modulator build 100 or the pressurizable vessel containing modulator build 100 is placed in a high temperature oven. The pressurizable vessel or oven has oxygen gas (O$_2$) flowing continuously through the vessel or oven throughout the duration of the indiffusion process. The oven or pressurizable vessel is then sealed and the pressure in the oven or vessel is raised to the adequate indiffusion level before commencing a temperature ramp-up process. Alternatively and within the inventive concept herein disclosed, the indiffusion process may be initiated by first sealing the oven or pressurizable vessel and then applying a conventional vacuum pump to eliminate contaminates from the indiffusion environment. The vacuum pump down may preferably be to approximately 100 microns or less to eliminate contaminants from the annealing environment. The vacuum pump down procedure is optional and in some instances the need to remove contaminants from the annealing environment may not be of concern. If the slip fit caps 112 do not make a good seal to the container 100 or if the plugs 104 do not make a good fit with the inside of container 100, creating a pressure differential across them may have the undesirable result of causing turbulence which deposits some powder 110 on chip 102. To avoid this, the vacuum step may be avoided and pressurized gas blown through the oven from port 124 (FIG. 3B) to port 122 (FIG. 3B) to eliminate most important contaminants without causing movement of powder 110. Once the oven or pressurizable vessel environment has been sealed and optionally vacuumed it is then pressurized with flowing oxygen gas (O$_2$). This oxygen need not be particularly pure and industrial or cutting grade oxygen as used with acetylene torches will suffice. The pressurized oxygen atmosphere serves to prevent oxygen outgassing. It should be noted that the atmosphere is a pure oxygen gas environment, no H$_2$O is present and thus no free protons or other radicals are given off that would adversely affect the crystal structure.

The Ti-indiffusion process of the present invention requires that the pressure in the O$_2$ atmosphere be raised to a value in a range from just above (approx. 1 psi) ambient atmospheric pressure to about 250 psi above ambient atmospheric pressure. An optimal indiffusion pressure range is from about 1 psi to about 25 psi above ambient atmospheric pressure, with about 6 psi above ambient atmospheric pressure being presently preferred. Applications have shown that pressures above 25 psi tend to cause the LiNbO$_3$ substrate to turn green in color. While the green discoloration does not appear to affect the structure negatively, to avoid this discoloration, pressures below 25 psi above ambient atmospheric pressure should be used.

After the oxygen pressurization has been implemented in the pressurized vessel or oven the temperature in the oven is then raised to the appropriate level that affects the necessary degree of Ti-indiffusion desired. In general, the temperature can be raised to a value in the range of about 900 degrees Celsius to about 1100 degrees Celsius. A preferred indiffusion temperature of about 1050 degrees Celsius will generally allow for the occurrence of the requisite titanium indiffusion. The ramp up rate for elevating the temperature in the oven may be in the range of about 0.5 degrees Celsius per minute to about 20 degrees Celsius per minute. The preferred ramp up rate is about 10 degrees Celsius per minute.

The required duration of the indiffusion process will depend upon the pressure at which the indiffusion process takes place. The indiffusion period is measured from the time at which the desired elevated temperature is reached. In general, the indiffusion process will last from about 2 hours to about 8 hours. The desired elevated temperature and elevated pressure should be maintained throughout the duration of the indiffusion process. Preferably, the indiffusion process will last about 6 hours to about 7 hours.

The indiffusion process is completed by cooling the lithium niobate structure in a rapid manner. The ramp down rate for modulator build 10 is preferred to be faster than about 20 degrees Celsius per minute until the crystal structure reaches a temperature of 300 degrees Celsius. At the point where modulator build 10 reaches about 300 degrees Celsius a slower ramp down rate may be used. The super cooling requirement is necessary to prohibit the undesired $LiNb_3O_8$, from forming and crystallizing in the substrate. $LiNb_3O_8$ will generally crystallize between about 300 degrees Celsius and about 800 degrees Celsius. Above about 800 degrees Celsius $LiNb_3O_8$ breaks down within the crystal substrate and below about 300 degrees Celsius $LiNb_3O_8$ will not form. Therefore, it is important to cool the substrate rapidly through the 800 degree Celsius to 300 degree Celsius region to avoid or minimize $LiNb_3O_8$ crystallization.

Figure 1E:
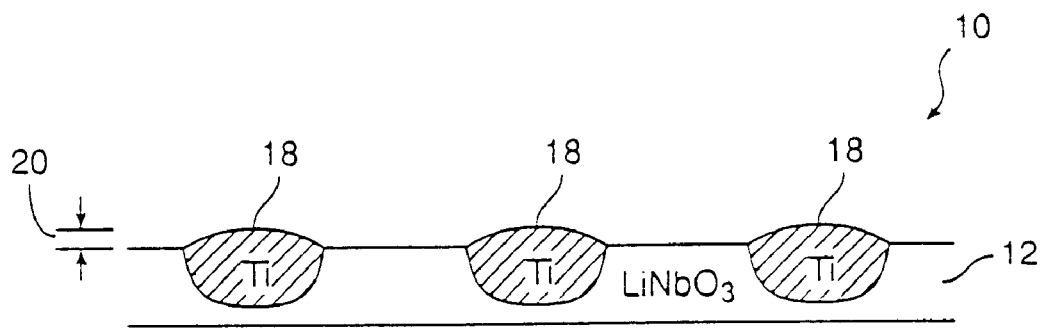

Referring again to the modulator build 10, FIG. 1E shows the modulator build 10 after completion of the Ti-indiffusion process. Titanium has indiffused into the crystal lattice and created the diffusion regions or waveguides regions 18. Titanium atoms will disperse interstitially throughout the waveguide region 18 and in some instances, replace niobium atoms in the crystal structure. The waveguide region will generally be about 6 microns in length and have a depth into $LiNbO_3$ crystal substrate 12 of about 6 microns. The resulting structure will have diffusion ridges 20 existing above the surface of $LiNbO_3$ crystal substrate 12. Diffusion ridges 20 have been shown to be beneficial in fabricating waveguides that are more prone to velocity matching the phase velocities of the optical signal and the microwave signal to extend the bandwidth of the modulation process. The elevation of prior art diffusion ridges have typically been in the 200 angstrom range. The diffusion ridge 20 that is formed from the pressurized Ti-indiffusion process of the present invention has shown elevations from the upper surface of the crystal to the top of the ridge of about 1000 up to about 1600 angstroms. A more pronounced diffusion ridge is instrumental in modulating the microwave and optical wave. In some instances, prior art modulator builds have used additional etching processes just to etch away the $LiNbO_3$ substrate as a way of artificially creating diffusion ridges. Additional etch processes are undesirable because they add processing time and pose the threat of damaging the crystal substrate.

Figure 1F:
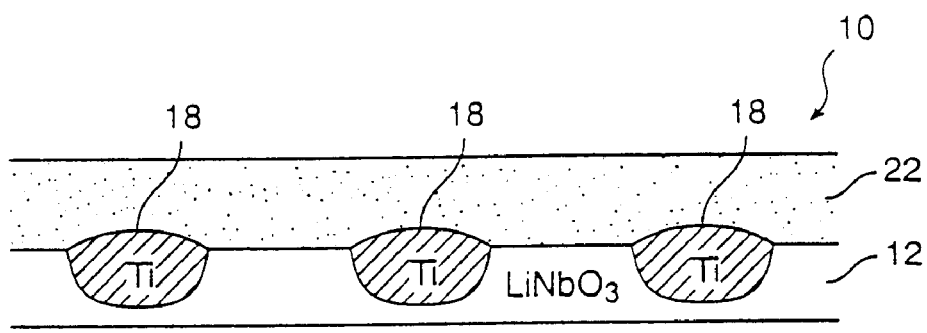

As shown in FIG. 1F, once the indiffusion process is completed a buffer layer 22 is placed over the entire modulator build 10. Buffer layer 22 serves as insulation and is generally about 500 to about 10000 angstroms in thickness, preferably about 3000 angstroms. Buffer layer 22 may comprise silicon oxide ($SiO_2$), silicon nitride ($Si_3N_4$ or other phases), a combination of silicon oxide and silicon nitride, indium tin oxide (ITO) or another suitable insulator material. A conventional deposition technique, such as sputtering, may be used to place buffer layer 22 over modulator build 10. It should be noted that the use of chemical vapor deposition (CVD) techniques should generally be avoided as such processing tends to generate undesirable free protons as discussed above with respect to wet etch processes.

Figure 1G:
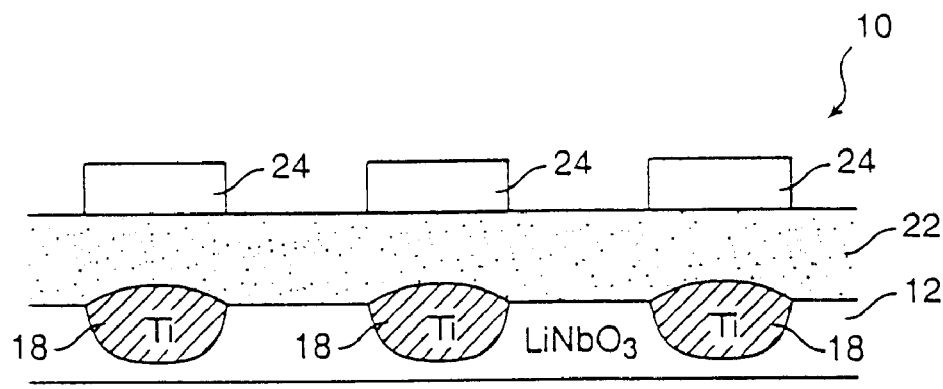

Referring to FIG. 1G, the modulator build 10 is completed by placing electrodes 24 above the buffer layer 22. As shown, electrodes 24 can be placed directly above waveguide regions 18 or they may be placed at other locations atop buffer layer 22. As is known by those of ordinary skill in the art, "Z" orientation modulators will have electrodes formed directly above the waveguides and "X" or "Y" orientation modulators will have electrodes formed offset from the waveguides. Standard deposition techniques are used to form electrodes 24 above buffer layer 22. A standard deposition technique may include a photoresist process, a conventional plasma deposition, sputtering or thermal evaporation process, a plasma etch process and a strip and acetone or propenyl wash process to eliminate the photoresist. As before, the introduction of free protons should be avoided. The electrodes may be formed from gold (Au), chromium gold, titanium and gold or other suitable electrode materials. The use of chromium and titanium in combination with gold or as a pure thin layer between buffer layer 22 and electrode 24 is for the purpose of increasing adhesion between the gold and the buffer layer. The electrodes will typically be about 0.1 micron to about 4 microns in thickness.

Once the electrodes have been fabricated, the modulator build 10 undergoes a post build anneal process to relieve stress in the crystal, the electrodes and/or the buffer layer. In some instances, this anneal step may also be performed after the formation of buffer layer 22. This anneal process may also preferably be conducted in a pressurized $O_2$ environment to eliminate the likelihood of free protons contaminating the modulator build. Lithium niobate has inherently high stress coefficients and relieving stress is essential to assure that output drift does not occur in the modulators. The preferred anneal temperature is about 300 degrees Celsius. The preferred anneal atmosphere is oxygen ($O_2$) at about 6 psi above ambient atmospheric pressure although a range of pressures above ambient from about 1 psi to about 25 psi above ambient atmospheric pressure will work. The preferred anneal duration is about 4 hours to about 6 hours. In the same manner as powdered lithium niobate is employed in the Ti-indiffusion process, the anneal process may also incorporate the use of powdered lithium niobate to lessen the likelihood of modulator build 10 outgassing $Li_2O$.

Figure 4:
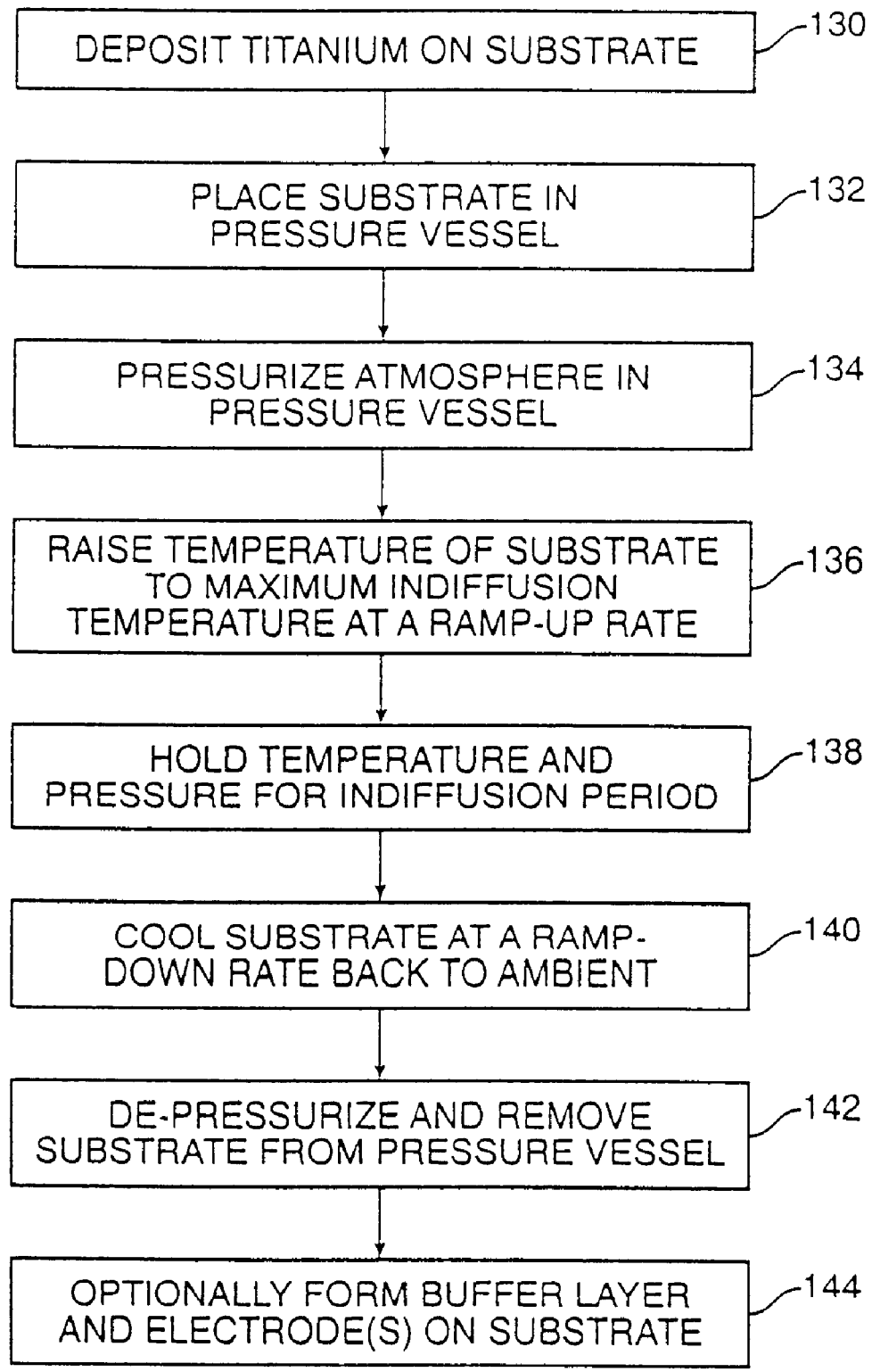
FIG. 4 is a process flow diagram of a process for fabricating structures in accordance with a presently preferred embodiment of the present invention.

FIG. 4 summarizes the fabrication procedures detailed above. At reference number 130 titanium is deposited on the substrate. At reference number 132 the substrate is placed in a pressure vessel. At reference number 134 the atmosphere in the pressure vessel is pressurized. At reference number 136 the temperature of the substrate is raised to the maximum indiffusion temperature at a selected ramp-up rate. At reference number 138 the pressure and temperature are held for the indiffusion period. At reference number 140 the substrate is cooled at a selected ramp-down rate back to about ambient (room) temperature. At reference number 142 the pressure vessel is depressurized and the substrate is removed. At reference number 144 a buffer layer is optionally formed and electrodes are optionally formed on the substrate.

Alternative Embodiments

Although illustrative presently preferred embodiments and applications of this invention are shown and described herein, many variations and modifications are possible which remain within the concept, scope and spirit of the invention, and these variations would become clear to those skilled in the art after a perusal of this application. The invention, therefore, is not limited except in spirit of the appended claims.

What is claimed is:

1. A method for fabricating a titanium-indiffusion waveguide, the method comprising:
   disposing titanium in the desired form of the waveguide on the surface of an electro-optic crystalline substrate;
   placing the substrate in a container;
   pressurizing the container with a gas to a pressure exceeding ambient atmospheric pressure, said gas being substantially free of water;
   heating the substrate for a period of time sufficient to cause the titanium to indiffuse into the substrate; and
   cooling the substrate down to ambient temperature.

2. A method according to claim 1 wherein said gas is oxygen.

3. A method according to claim 2, wherein the substrate comprises lithium niobate.

4. A method according to claim 3, wherein said heating further comprises:
   ramping up the temperature of the substrate at a rate in a range of about 0.5 degree C. per minute to about 20 degrees C. per minute.

5. A method according to claim 6, wherein said period of time is in excess of one hour.

6. A method according to claim 5, wherein said cooling further comprises:
   ramping down the temperature of the substrate at a rate in excess of about 20 degrees C. per minute until said substrate reaches a temperature below about 300 degrees C.

7. A method according to claim 6, wherein said temperature sufficient to cause the titanium to indiffuse is in a range of about 900 degrees C. to about 1100 degrees C.

8. A method according to claim 7, further comprising:
   continuously advancing oxygen gas through the container during said heating, said period of time and said cooling.

9. A method according to claim 8, further comprising:
   applying a vacuum to the container prior to said pressurizing.

10. A method according to claim 2, wherein the substrate comprises lithium tantalate.

11. A method according to claim 2, wherein the substrate comprises a compound having the chemical formula $RMO_3$, where R represents an alkaline earth metal, M represents a Group IV-B or Group V-B metal, and O is oxygen.

12. A method according to claim 2, wherein said pressurizing is performed within a range of about 1 psi and 250 psi above ambient atmospheric pressure.

13. A method according to claim 2, wherein said pressurizing is performed at about 6 psi above ambient atmospheric pressure.

14. A method according to claim 2, wherein said pressurizing is performed within a range of about 1 psi and 25 psi above ambient atmospheric pressure.

15. A method according to claim 1, wherein the substrate comprises lithium niobate.

16. A method according to claim 1, wherein the substrate comprises lithium tantalate.

17. A method according to claim 1, wherein the substrate comprises a compound having the chemical formula $RMO_3$, where R represents an alkaline earth metal, M represents a Group IV-B or Group V-B metal, and O is oxygen.

18. A method according to claim 1, wherein said heating further comprises:
   ramping up the temperature of the substrate at a rate in a range of about 0.5 degree C. per minute to about 20 degrees C. per minute.

19. A method according to claim 18, wherein said period of time is in excess of one hour.

20. A method according to claim 19, wherein said cooling further comprises:
   ramping down the temperature of the substrate at a rate in excess of about 20 degrees C. per minute until said substrate reaches a temperature below about 300 degrees C.

21. A method according to claim 20, wherein said temperature sufficient to cause the titanium to indiffuse is in a range of about 900 degrees C. to about 1100 degrees C.

22. A method according to claim 1, further comprising:
   placing a powder comprising the same material as the substrate in the container prior to said heating.

23. A method according to claim 22, further comprising:
   isolating said powder in a first region of said container so that gas in said first region can pass to a second region containing said substrate but powder in said first region cannot easily pass into said second region.

24. A method according to claim 1, further comprising:
   depressurizing the container after said cooling.

25. A method for fabricating an optical modulator having at least two titanium indiffusion waveguides, said method comprising:
   disposing a pair of titanium strips in the desired form of at least a pair of corresponding waveguides on the surface of an electro-optic crystalline substrate;
   placing the substrate in a container;
   pressurizing the container with a gas to a pressure exceeding ambient atmospheric pressure;
   heating the substrate for a period of time sufficient to cause the titanium to indiffuse into the substrate; and
   cooling the substrate down to ambient temperature.

26. A method according to claim 25, wherein said gas is oxygen.

27. A method according to claim 26, wherein the substrate comprises lithium niobate.

28. A method according to claim 27, wherein said heating comprises:
   ramping up the temperature of the substrate at a rate in a range of about 0.5 degree C. per minute to about 20 degrees C. per minute.

29. A method according to claim 28, wherein said period of time is in excess of one hour.

30. A method according to claim 29, wherein said cooling further comprises:
   ramping down the temperature of the substrate at a rate in excess of about 20 degrees per minute until said substrate reaches a temperature below about 300 degrees C.

31. A method according to claim 30, wherein said temperature sufficient to cause the titanium to indiffuse is in a range of about 900 degrees C. to about 1100 degrees C.

32. A method according to claim 31, further comprising:
   continuously advancing oxygen gas through the container during said heating, said period of time and said cooling.

33. A method according to claim 32, further comprising:
   applying a vacuum to the container prior to said pressurizing.

34. A method according to claim 26, wherein the substrate comprises lithium tantalate.

35. A method according to claim 26, wherein the substrate comprises a compound having the chemical formula $RMO_3$, where R represents an alkaline earth metal, M represents a Group IV-B or Group V-B metal, and O is oxygen.

36. A method according to claim 26, wherein said pressurizing is performed within a range of about 1 psi and 250 psi above ambient atmospheric pressure.

37. A method according to claim 26, wherein said pressurizing is performed at about 6 psi above ambient atmospheric pressure.

38. A method according to claim 26, further comprising:
placing a powder comprising the same material as the substrate in the container prior to said heating.

39. A method according to claim 38, further comprising:
isolating said powder in a first region of said container so that gas in said first region can pass to a second region containing said substrate but powder in said first region cannot easily pass into said second region.

40. A method according to claim 26, wherein said pressurizing is performed within a range of about 1 psi and 25 psi above ambient atmospheric pressure.

41. A method according to claim 25, wherein the substrate comprises lithium niobate.

42. A method according to claim 25, wherein the substrate comprises lithium tantalate.

43. A method according to claim 25, wherein the substrate comprises a compound having the chemical formula $RMO_3$, where R represents an alkaline earth metal, M represents a Group IV-B or Group V-B metal, and O is oxygen.

44. A method according to claim 25, wherein said heating further comprises:
ramping up the temperature of the substrate at a rate in a range of about 0.5 degree C. per minute to about 20 degrees C. per minute.

45. A method according to claim 41, wherein said period of time is in excess of one hour.

46. A method according to claim 45, wherein said cooling further comprises:
ramping down the temperature of the substrate at a rate in excess of about 20 degrees C. per minute until said substrate reaches a temperature below about 300 degrees C.

47. A method according to claim 46, wherein said temperature sufficient to cause the titanium to indiffuse is in a range of about 900 degrees C. to about 1100 degrees C.

48. A method according to claim 25, further comprising:
placing a powder comprising the same material as the substrate in the container prior to said hearing.

49. A method according to claim 48, further comprising:
isolating said powder in a first region of said container so that gas in said first region can pass to a second region containing said substrate but powder in said first region cannot easily pass into said second region.

50. A method according to claim 25, further comprising: depressurizing the container after said cooling.

51. A method for fabricating an optical modulator having at least two titanium indiffusion waveguides, said method comprising:
disposing a pair of titanium strips in the desired form of at least a pair of corresponding waveguides on the surface of an electro-optic crystalline substrate;
placing the substrate in a first region of container having a first region and a second region, said first region isolated from said second region so that gas can easily pass between said first and second regions but powder cannot so easily pass;
placing a powder formed of the same material as said substrate in the second region;
pressurizing the container with a gas to a pressure exceeding ambient atmospheric pressure;
heating the substrate for a period of time sufficient to cause the titanium to indiffuse into the substrate;
cooling the substrate down to ambient temperature;
disposing a buffer layer over at least the titanium-indiffused portion of the substrate; and
disposing electrodes on the buffer layer.

52. A method according to claim 51 wherein said pressurizing includes pressurizing the container with oxygen to a pressure within a range of about 1 psi to about 25 psi above ambient atmospheric pressure.

53. A method according to claim 52 wherein said substrate comprises lithium niobate.

54. A method according to claim 51, further comprising: depressurizing the container after said cooling.

55. A titanium indiffusion waveguide structure, comprising:
an electro-optic crystalline substrate; and
a titanium-indiffusion region substantially free of hydrogen ions, said region extending beneath the surface of the substrate, and extending above the nominal surface of said crystalline substrate so as to form a diffusion ridge, said diffusion ridge having an elevation substantially higher than 200 angstroms.

56. A structure according to claim 55, further comprising:
a buffer layer disposed over at least said region.

57. A structure according to claim 56, wherein the substrate comprises lithium tantalate.

58. A structure according to claim 56, wherein the substrate comprises a compound having the chemical formula $RMO_3$, where R represents an alkaline earth metal, M represents a Group IV-B or Group V-B metal, and O is oxygen.

59. A structure according to claim 56, wherein the substrate comprises lithium niobate.

60. A structure according to claim 59, wherein said buffer layer includes one or more members of the group consisting of:
silicon nitride ($Si_3N_4$) and Indium Tin Oxide (ITO).

61. A structure according to claim 60, further comprising an electrode disposed over said buffer layer.

62. A structure according to claim 61, wherein said electrode comprises gold.

63. A structure to claim 60, further comprising:
a layer including chromium disposed over said buffer layer, and
an electrode disposed over said chromium-containing layer, said electrode containing gold.

64. A structure according to claim 55, wherein said diffusion ridge extends in a range of about 1000 angstroms to about 1600 angstroms over the nominal surface of said crystalline substrate.

65. A structure according to claim 55, wherein said diffusion ridge has an elevation in a range of about 1000 angstroms to about 1600 angstroms.

66. An optical modulator structure, comprising:
an electro-optic crystalline substrate; and
at least a pair of titanium-indiffusion regions substantially free of hydrogen ions, said regions extending beneath the surface of the substrate, and extending above the nominal surface of said crystalline substrate so as to form diffusion ridges, said diffusion ridge having an elevation substantially higher than 200 angstroms.

67. A structure according to claim 66, further comprising:
a buffer layer disposed over at least said regions.

68. A structure according to claim 67, wherein the substrate comprises lithium tantalate.

69. A structure according to claim 67, wherein the substrate comprises a compound having the chemical formula $RMO_3$, where R represents an alkaline earth metal, M represents a Group IV-B or Group V-B metal, and O is oxygen.

70. A structure according to claim 67, wherein the substrate comprises lithium niobate.

71. A structure according to claim 70, wherein said buffer layer includes one or more members of the group consisting of:
Silicon Dioxide ($SiO_2$), Silicon Nitride ($Si_3N_4$) and Indium Tin Oxide (ITO).

72. A structure according to claim 71, further comprising an electrode disposed over said buffer layer.

73. A structure according to claim 72, wherein said electrode comprises gold.

74. A structure according to claim 71, further comprising:
a layer including chromium disposed over said buffer layer; and
an electrode disposed over said chromium-containing layer, said electrode containing gold.

75. A structure according to claim 66, wherein said diffusion ridge extends in a range of about 1000 angstroms to about 1600 angstroms over the nominal surface of said crystalline substrate.

76. A structure according to claim 66, wherein said diffusion ridge has an elevation in a range of about 1000 angstroms to about 1600 angstroms.

* * * * *

UNITED STATES PATENT AND TRADEMARK OFFICE
CERTIFICATE OF CORRECTION

PATENT NO. : 6,567,598 B1
DATED : May 20, 2003
INVENTOR(S) : Lee J. Burrows

It is certified that error appears in the above-identified patent and that said Letters Patent is hereby corrected as shown below:

Column 3,
Line 29, replace "LiNb$_3$O" with -- LiNb$_3$O$_8$ --.
Lines 55, 56 and 66, replace "out diffusion" with -- outdiffusion --.

Column 11,
Line 27, replace "6" with -- 4 --.

Column 12,
Line 35, after "pressure" insert -- , said gas being substantially free of water --.

Column 13,
Line 37, replace "41" with -- 44 --.
Line 48, replace "25" with -- 26 --.

Signed and Sealed this

Seventeenth Day of February, 2004

JON W. DUDAS
*Acting Director of the United States Patent and Trademark Office*